(12) United States Patent
Sundstrom

(10) Patent No.: US 8,094,490 B1
(45) Date of Patent: Jan. 10, 2012

(54) NONVOLATILE LOOP MAGNETIC MEMORY

(75) Inventor: Lance L. Sundstrom, Pinellas Park, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 406 days.

(21) Appl. No.: 12/461,228

(22) Filed: Aug. 5, 2009

(51) Int. Cl.
*G11C 11/14* (2006.01)
(52) U.S. Cl. ............................. 365/171; 365/1
(58) Field of Classification Search ............... 365/1, 171
See application file for complete search history.

(56) References Cited

U.S. PATENT DOCUMENTS

| | | | | |
|---|---|---|---|---|
| 2,814,793 | A | * | 11/1957 | Bonn .............................. 360/54 |
| 5,005,096 | A | | 4/1991 | Krounbi et al. .......... 360/327.31 |
| H1990 | H | | 9/2001 | Kherat et al. ............... 338/32 R |

* cited by examiner

*Primary Examiner* — Jason Lappas
(74) *Attorney, Agent, or Firm* — John Tarlano

(57) ABSTRACT

A nonvolatile loop magnetic memory having a magnetically writeable nonvolatile magnetic memory element and a loop magnetic shunt. The loop magnetic shunt has a slot through a loop of the loop magnetic shunt, the slot forming first and second ends in the loop magnetic shunt, the first and second ends arranged to focus a magnetic field on the magnetically writeable nonvolatile magnetic memory element. The magnetically writeable nonvolatile magnetic memory element is located between the first and second ends of the loop magnetic shunt. A magnetic write coil is wrapped around the loop magnetic shunt.

8 Claims, 8 Drawing Sheets

NONVOLATILE LOOP MAGNETIC MEMORY

The disclosed nonvolatile loop magnetic memory has a magnetically writable magnetic memory element, a slotted loop magnetic shunt and a single-turn or multi-turn magnetic write coil wrapped around the slotted loop magnetic shunt. The slot is located in the loop of the slotted loop magnetic shunt. The magnetically writable magnetic memory element is located within the slot of the slotted loop magnetic shunt.

Alternatively, two single-turn or multi-turn magnetic write coils are wrapped around the slotted loop magnetic shunt. Still alternatively, three or more single-turn or multi-turn magnetic write coils are wrapped around the slotted loop magnetic shunt.

A write current generator is connected to the magnetic write coil. Current is passed through the magnetic write coil in a first direction or in a second, reverse, direction. The current passing through the magnetic write coil produces a write magnetic field in a first direction or in a second, reverse, direction.

The write magnetic field in the first direction is conveyed by the slotted loop magnetic shunt to the magnetic memory element. The conveyed write magnetic field magnetizes the magnetic memory element, placing the magnetic memory element into a first magnetic state. The write magnetic field in the second direction is conveyed by the slotted loop magnetic shunt to the magnetic memory element. The conveyed write magnetic field magnetizes the magnetic memory element, placing the magnetic memory element into a second magnetic state.

The write current generator sends a write current through the magnetic write coil in a first direction or in a second direction. The write current generator sends a current in the first direction to write a zero magnetic bit state into the magnetically writeable magnetic memory element of the loop magnetic memory. The write current generator sends a current in the second direction to write a one magnetic bit state into the magnetically writeable magnetic memory element of the loop magnetic memory.

Alternatively two write current generators are separately connected to two magnetic write coils, each write coil wrapped around the same slotted loop magnetic shunt. Current is passed through a first magnetic write coil in a first direction. Current is passed through a second magnetic write coil in a first direction. The current passing through the first write coil produces a half-write magnetic field in a first direction. The current passing through the second write coil produces a half-write magnetic field in a first direction. The two half-write magnetic fields are conveyed by the slotted loop magnetic shunt to write the magnetic memory element. The two conveyed half-write magnetic fields add together to magnetize the magnetic memory element into a first magnetic bit state.

With the two write current generators separately connected to two magnetic write coils, current is passed through a first magnetic write coil in a second direction. Current is passed through a second magnetic write coil in a second direction. The current passing through the first write coil produces a half-write magnetic field in a second direction. The current passing through the second write coil produces a half-write magnetic field in a second direction. The two half-write magnetic fields are conveyed by the slotted loop magnetic shunt to write the magnetic memory element. The two conveyed half-write magnetic fields add together to magnetize the magnetic memory element into a second magnetic bit state.

A stand-alone magnetic tunnel junction (MTJ) memory element is a rectangular, typically square, thin film structure comprised of two or more magnetic layers, for example NiFe, CoFe and/or NiFeCo, separated by nonmagnetic layers, for example Cu or Ru, insulating layers, for example Al2O3, and an antiferromagnetic (AFM) layer, for example FeMn, IrMn or PtMn, electrically terminated at the top and bottom on the stack.

As the relative magnetization directions of its magnetic layers are switched from parallel to anti-parallel, its top-bottom stack resistance switches low to high due to spin dependent tunneling (SDT) through the stack. This stored resistance state is nonvolatile. The low-high resistance change (DELTA R) is a percentage of its low resistance value (R).

The resistance of a MTJ element is proportional to its stack height and inversely proportional to its stack area. The resistance tolerance of a MTJ element is inversely proportional to its stack area.

One or more MTJ memory elements can be connected in series to form a MTJ memory bit with a (DELTA R) large enough to sense. MTJ elements are written by applying a write current through a write coil, and slotted loop magnetic shunt that encompasses the memory element or elements.

SUMMARY OF THE INVENTION

A nonvolatile loop magnetic memory comprising a magnetically writeable nonvolatile magnetic memory element, a loop magnetic shunt, the loop magnetic shunt having a slot through a loop of the loop magnetic shunt, the slot forming first and second ends in the loop magnetic shunt, the first and second ends arranged to focus a magnetic field on the magnetically writeable nonvolatile magnetic memory element, the magnetically writeable nonvolatile magnetic memory element located between the first and second ends of the loop magnetic shunt, and a magnetic write coil wrapped around the loop magnetic shunt.

DESCRIPTION OF THE PREFERRED EMBODIMENT

Figure 1:
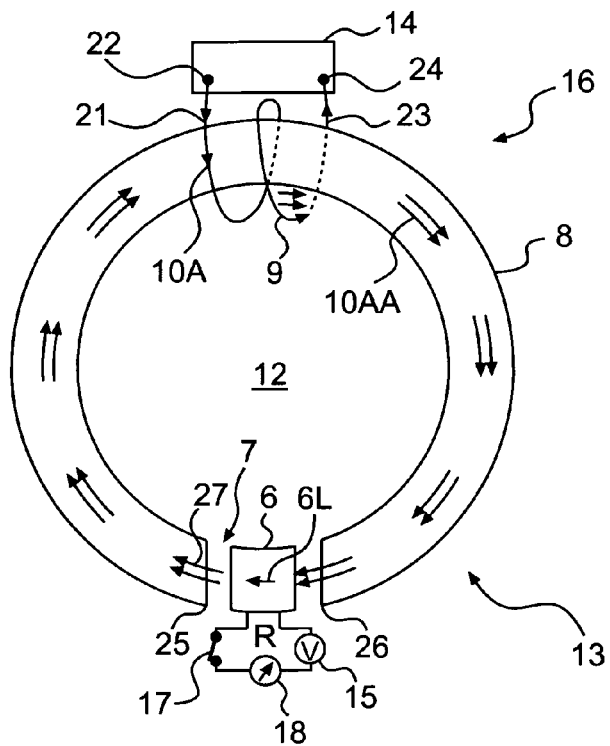
FIG. 1 is a plan view of a nonvolatile loop magnetic memory, the nonvolatile loop magnetic memory having a single magnetically writeable magnetic memory element, a slotted loop magnetic shunt and a magnetic write coil, the magnetically writeable magnetic memory element being written by a clockwise magnetic field generated by the slotted loop magnetic shunt, the magnetic write coil and a write current generator.

FIG. 1 shows a magnetically writeable nonvolatile magnetic memory element 6. A slot 7 is through a loop magnetic shunt 8. The slot 7 forms two ends 25 and 26 in loop magnetic shunt 8. The magnetically writeable nonvolatile magnetic memory element 6 is located between the two ends 25 and 26 of the loop magnetic shunt 8. The slotted loop magnet shunt 8 can be made from a material such as a fast magnetic direction switching iron based material.

A single or multi-turn magnet write coil 9 is wound around the slotted loop magnetic shunt 8. The magnetic coil can be made from a metal such as copper. The nonvolatile magnetic memory element 6, the slotted loop magnetic shunt 8 and the magnetic write coil 9 together form a nonvolatile loop magnetic memory 12.

In FIG. 1, top and bottom magnetic layers of nonvolatile magnetic memory element 6 have parallel polarizations. The nonvolatile magnetic memory element 6 can be a nonvolatile magnetic tunnel junction (MTJ) memory element. A first bottom layer of magnetic memory element 6 is pinned, to have a polarization leftward in FIGS. 1 and 2. A second top layer of magnetic memory element 6 is polarized leftward in FIG. 1, by a magnetic field 27 produced by passing a current 10A through magnetic write coil 9 by the right hand rule.

The slotted loop magnetic shunt 8 and magnetic write coil 9 together form a 1×1 loop magnetic shunt array 13. The loop magnetic shunt array 13 has both the loop magnetic shunt 8 and magnetic write coil 9. The magnetic write coil 9 produces a sufficient magnetic field 27 to write magnetic memory element 6 into a zero bit state in FIG. 1. The magnetic write coil 9 produces a sufficient magnetic field 32 to write magnetic memory element 6 into a one bit state in FIG. 2.

A loop magnetic shunt array could alternatively have two magnetic write coils wrapped around a single slotted loop magnetic shunt. The two magnetic write coils could act together to produce a sufficient magnetic field to write a magnetic memory element into a zero bit state or into a one bit state.

A write current generator 14 is connected to magnetic write coil 9. The nonvolatile loop magnetic memory 12 and the write current generator 14 form a nonvolatile loop magnetic memory circuit 16.

The nonvolatile magnetic memory element 6 can be a nonvolatile magnetic tunnel junction (MTJ) memory element. Another type of magnetically writeable nonvolatile magnetic memory element can be used in place of a nonvolatile magnetic tunnel junction (MTJ) memory element, within slot 7 of loop magnetic shunt 8.

Loop magnetic shunt 8 can have a nearly circular structure. Nearly circular loop magnetic shunt 8 has a slot 7 that has been cut through a total loop of the loop magnetic shunt 8, to form the nearly circular loop magnetic shunt 8. The slot 7 forms ends 25 and 26 in the nearly circular loop magnetic shunt 8. The ends 25 and 26 in the nearly circular loop magnetic shunt 8 are arranged to focus a magnetic field between ends 25 and 26.

A loop magnetic shunt 8 could have multiple slots in the loop of loop magnetic shunt 8, rather than having only a single slot 7 in the loop. Again, slot 7 forms ends 25 and 26 of shunt 8.

A slotted magnetic shunt could have another shape such as a rectangular shape. A loop magnetic shunt could have multiple slots in the loop magnetic shunt to produce two half-loop sections of a double-slotted loop magnetic shunt. A multiple-slotted loop magnetic shunt could have multiple magnetic memory elements, each magnetic memory element located in a separate slot of multiple slots in a slotted loop magnetic shunt. A loop magnetic shunt having two slots in the loop of the loop magnetic shunt, produces two half-loop sections of a loop magnetic shunt. A double-slotted loop magnetic shunt is produced by the two slots in a loop magnetic shunt.

End 21 of magnetic write coil 9 is connected to terminal 22 of write current generator 14. End 23 of magnetic write coil 9 is connected to terminal 24 of write current, generator 14.

In FIG. 1, a focused magnetic field 27 is created between ends 25 and 26 of nearly circular loop magnetic shunt 8 when a current 10A is passed from terminal 22, through magnetic write coil 9, into terminal 24. Current 10A produces a magnetic field 10AA in loop magnetic shunt 8 in accordance with the right hand rule of electromagnetism. Magnetic field 10AA produces focused magnetic field 27 between ends 25 and 25 of loop magnetic shunt 8. The top, free, that is, non-pinned, magnetic layer of nonvolatile magnetic memory element 6 is magnetized to have a clockwise magnetic polarization in direction 6L, by magnetic field 27.

Figure 2:
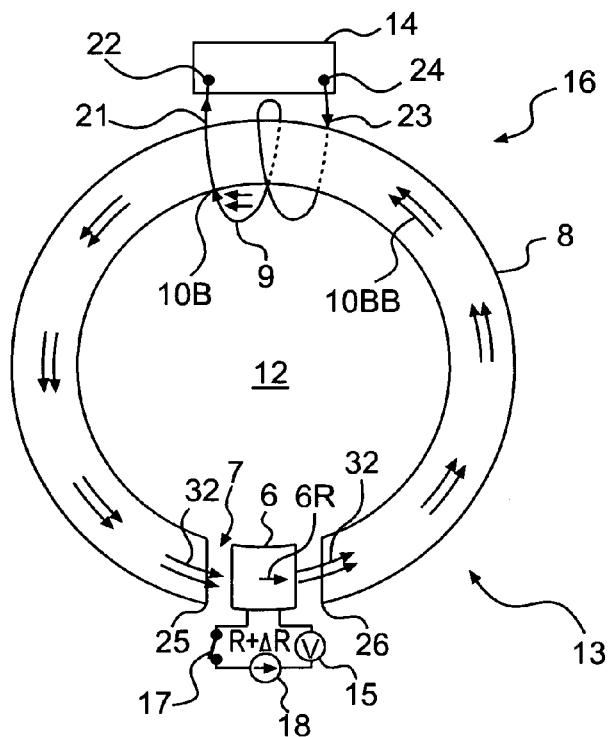
FIG. 2 is a plan view of a nonvolatile loop magnetic memory, the nonvolatile loop magnetic memory having a single magnetically writeable magnetic memory element, a slotted loop magnetic shunt and a magnetic write coil, the magnetically writeable magnetic memory element being written by a counter-clockwise magnetic field generated by the slotted loop magnetic shunt, the magnetic write coil and a write current generator.

A top, free, magnetic layer of single magnetic tunnel junction (MTJ) memory element 6 is given a magnetic polarization 6L that is parallel to the polarization of the pinned bottom magnetic layer, in FIG. 1, and a magnetic polarization 6R that is anti-parallel to the polarization of the pinned layer, in FIG. 2. Parallel magnetic polarization 6L produces a low resistance R in nonvolatile magnetic memory element 6. Anti-parallel magnetic polarization 6R produces a high resistance (R+Delta R) in nonvolatile magnetic memory element 6, shown in FIG. 2. Magnetic field 27 is applied to nonvolatile magnetic tunnel junction (MTJ) memory element 6 to produce magnetic polarization 6L in nonvolatile magnetic memory element 6. Magnetic polarization 6L gives nonvolatile magnetic memory element 6 an electrical resistance of R.

After nonvolatile magnetic memory element 6 has been nonvolatilely written by magnetic field 27, a voltage supply device 15 applies a voltage to memory 6 when switch 17 is closed. Resistance measuring device 18 measures the electrical resistance R of nonvolatile magnetic memory element 6. Resistance measuring device 18 indicates that nonvolatile magnetic memory device 6 has a resistance R. Resistance R signifies that a nonvolatile zero bit state has been nonvolatilely stored in the magnetic memory element 6.

In FIG. 1 the loop magnetic shunt 8 is composed of a material that transmits a magnetic field 10AA from the magnetic write coil 9 to ends 25 and 26 of the loop magnetic shunt 8. Iron-based material layers, such as NiFe, CoFe, and/or NiFeCo layers, are laminated in order to form the loop magnetic shunt 8.

FIG. 1 shows magnetic field 27 located between ends 25 and 26 of loop magnetic shunt 8. Magnetic field 27 points in a clockwise direction, since current is passed out of terminal 22 of write current generator 14, through magnetic write coil 9, and into terminal 24 of write current generator 14.

FIG. 2 also shows the components of the magnetic shunt array 13. In FIG. 2 current 10B passes through coil 9 in a direction that is opposite to the direction of current 10A shown in FIG. 1. Current 10B forms a magnetic field 10BB in shunt 8. Magnetic field 10BB forms a magnetic field 32 between ends 25 and 26 of shunt 8. The magnetic field 32, between ends 25 and 26, points in a counter-clockwise direction, in FIG. 2. Magnetic field 32 is applied to nonvolatile magnetic tunnel junction memory element 6 to produce magnetic polarization 6R in nonvolatile magnetic memory element 6. Magnetic polarization 6R gives nonvolatile magnetic memory element 6 an electrical resistance of (R+Delta R).

In FIG. 2, the two magnetic layers of MTJ memory element 6 have anti-parallel polarizations. A first layer of nonvolatile magnetic memory element 6 is pinned to have a polarization leftward in FIG. 2. A second layer of nonvolatile magnetic memory element 6 is polarized rightward in FIG. 2, by a magnetic field 32 produced by passing a current 10B through magnetic write coil 9 by the right hand rule.

After nonvolatile magnetic memory element 6 has been nonvolatilely written by magnetic field 32, voltage supply device 15 applies a voltage to memory 6 when switch 17 is closed. Resistance measuring device 18 measures the electrical resistance of magnetic memory element 6. Resistance measuring device 18 indicates that nonvolatile magnetic memory device 6 has a resistance (R+Delta R). Resistance (R+Delta R) signifies that a nonvolatile one bit state has been stored in magnetic memory element 6.

In FIG. 1 the write current generator 14 sends current 10A into end 21 of coil 9 and out of end 23 of coil 9. In FIG. 2 the write current generator 14 sends current 10B into end 23 of coil 9, and out of end 21 of coil 9.

In FIG. 1, a magnetic field 27, located between ends 25 and 26 of magnetic shunt 8, points toward end 25. That is, the magnetic field 27 is in a clockwise direction in FIG. 1.

In FIG. 2, a magnetic field 32, located between ends 25 and 26 of magnetic shunt 8, points toward end 26. That is, the magnetic field 32 is in a counter-clockwise direction in FIG. 2.

Figure 3:
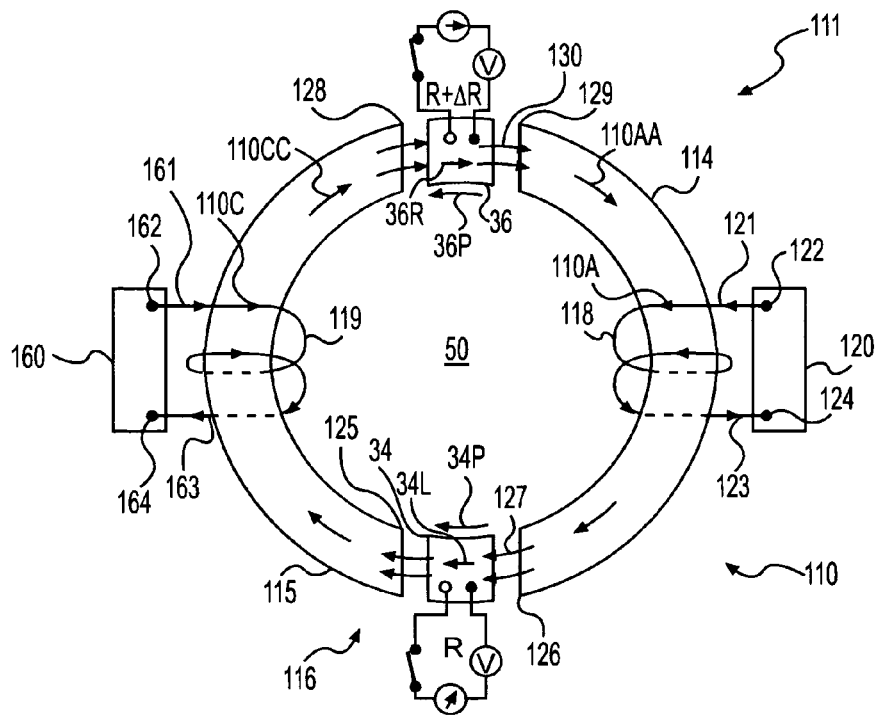
FIG. 3 is a plan view of a nonvolatile loop magnetic memory, the nonvolatile loop magnetic memory having first and second magnetically writeable magnetic memory elements, two half-loop magnetic shunt sections and two magnetic write coils, the first and second magnetically writeable magnetic memory elements being written by clockwise magnetic fields generated by the two half-loop magnetic shunt sections, the two magnetic write coils and two write current generators.

In FIG. 3 the half-loop magnetic shunt sections 114 and 115, plus magnetic write coils 118 and 119, form a loop magnetic shunt array 110. The looped magnetic shunt array 110 has the half-loop magnetic shunt sections 114 and 115 of loop magnetic shunt 116, plus magnetic write coils 118 and 119. The magnetic write coils 118 and 119 produce sufficient magnetic fields 127 and 130 to write magnetic memory elements 34 and 36.

In FIG. 3, magnetic fields 127 and 130 are applied to magnetic tunnel junction memory elements 34 and 36. The top magnetic layer of memory element 34 is given a polarization 34L pointing to the left and in the direction of left pointing polarization 34P of the pinned bottom layer of memory element 34. The top magnetic layer of memory element 36 is given a polarization 36R pointing to the right and in a direction that is opposite to the left pointing polarization direction 36P of the pinned bottom layer of memory element 36. Memory element 34 has a polarization 34L that is parallel to polarization direction 34P. Memory element 36 has a polarization 36R that is anti-parallel to polarization direction 36P.

Figure 4:
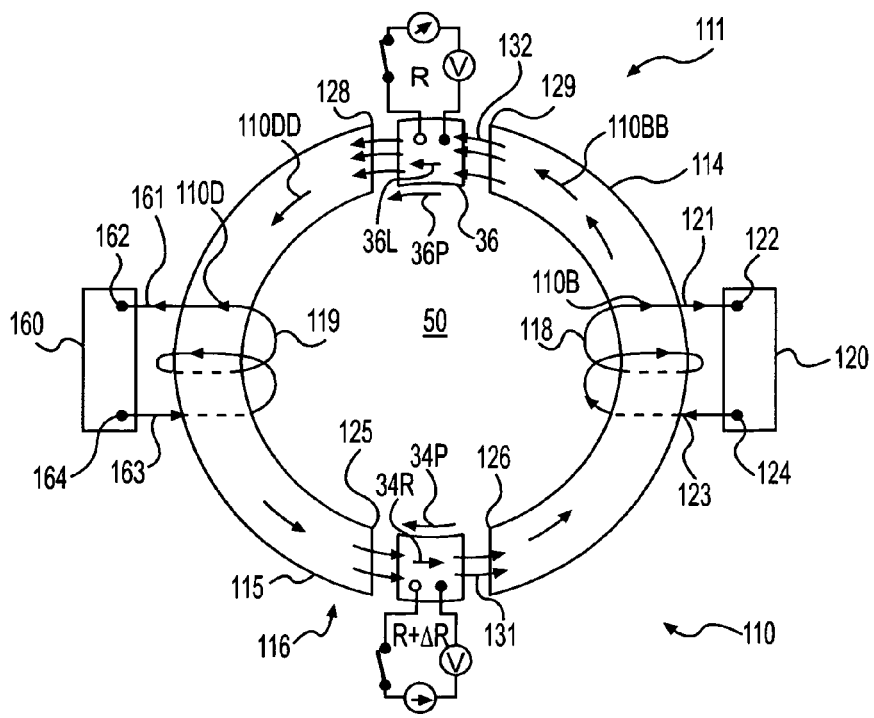
FIG. 4 is a plan view of a nonvolatile loop magnetic memory, the nonvolatile loop magnetic memory having first and second magnetically writeable magnetic memory elements, two half-loop magnetic shunt sections and two magnetic write coils, the first and second magnetically writeable magnetic memory elements being written by counter-clockwise magnetic fields generated by the two half-loop magnetic shunt sections, the two magnetic write coils and two write current generators.

Memory element 34 has a parallel polarization 34L, shown in FIG. 3, and an anti-parallel polarization 34R, shown in FIG. 4. A parallel polarization gives the magnetic memory element 34 a resistance R in FIG. 3. An anti-parallel polarization gives the magnetic memory element 34 a resistance (R+Delta R) in FIG. 4.

Memory element 36 has an anti-parallel polarization 36R, shown in FIG. 3, and a parallel polarization 36L, shown in FIG. 4. An anti-parallel polarization gives the magnetic memory element 36 a resistance (R+Delta R) in FIG. 3. A parallel polarization gives the magnetic memory element 36 a resistance R in FIG. 4.

In FIG. 3, magnetic fields 127 and 130 give element 34 an electrical resistance of R and give memory element 36 an electrical resistance of (R+Delta R). Memory elements 34 and 36, half-loop magnetic shunt sections 114 and 115 and coils 118 and 119 together form nonvolatile loop magnetic memory 50.

Again, FIG. 3 shows nonvolatile loop magnetic memory 50. The nonvolatile loop magnetic memory 50 of FIG. 3 is written by magnetic shunt array 110. Magnetic tunnel junction memory element 34 is located between first ends 125 and 126 respectively of half-loop magnetic shunt sections 114 and 115. Magnetic tunnel junction memory element 36 is located between second ends 128 and 129 respectively of half-loop magnetic shunt sections 114 and 115.

When a current 110A is sent into end 121 and out of end 123 of write coil 118 a magnetic field 110AA is created in half-loop section 114. When a write current 110C is sent into end 161 and out of end 123 of write coil 119, a magnetic field 110CC is created in half-loop section 115. Magnetic fields 110AA and 110CC produce magnetic field 127 between first ends 125 and 126 of half-loop sections 114 and 115, and produce magnetic field 130 between second ends 128 and 129 of half-loop sections 114 and 115. Magnetic field 127 causes a zero bit to be written into memory element 34. Magnetic field 130 causes a one bit to be written into memory element 36. Memory element 34 of FIG. 3 is made to have an electrical resistance of R and memory element 36 of FIG. 3 is made to have an electrical resistance of (R+Delta R).

FIG. 4 also shows nonvolatile loop magnetic memory 50. In FIG. 4, a zero bit is written into memory element 36 and a one bit into memory element 34, by sending a write current 110E out of end 123 of coil 118 and into end 121 of write coil 118, and by sending a write current 110D out of end 163 of coil 119 and into end 161 of write coil 119. Write current 110B produces a magnetic field 110BB in half-loop section 114. Write current 110D produces a magnetic field 110DD in half-loop section 115. Magnetic fields 110BB and 110DD produce a magnetic field 131 between first ends 125 and 126 of half-loop sections 114 and 115. Magnetic fields 110BB and 110DD produce a magnetic field 132 between second ends 128 and 129 of half-loop sections 114 and 115. Magnetic field 131 writes memory element 34 to have a one bit. Magnetic field 132 writes memory element 36 to have a zero bit.

Memory element 34 of FIG. 4 is made to have an electrical resistance of (R+Delta R). Memory element 36 of FIG. 4 is made to have an electrical resistance of R.

Write current generator 120 is connected to magnetic write coil 118. Write current generator 160 is connected to magnetic write coil 119. The loop magnetic memory 50 and the write current generators 120 and 160 form a nonvolatile loop magnetic memory circuit 111.

Figure 5:
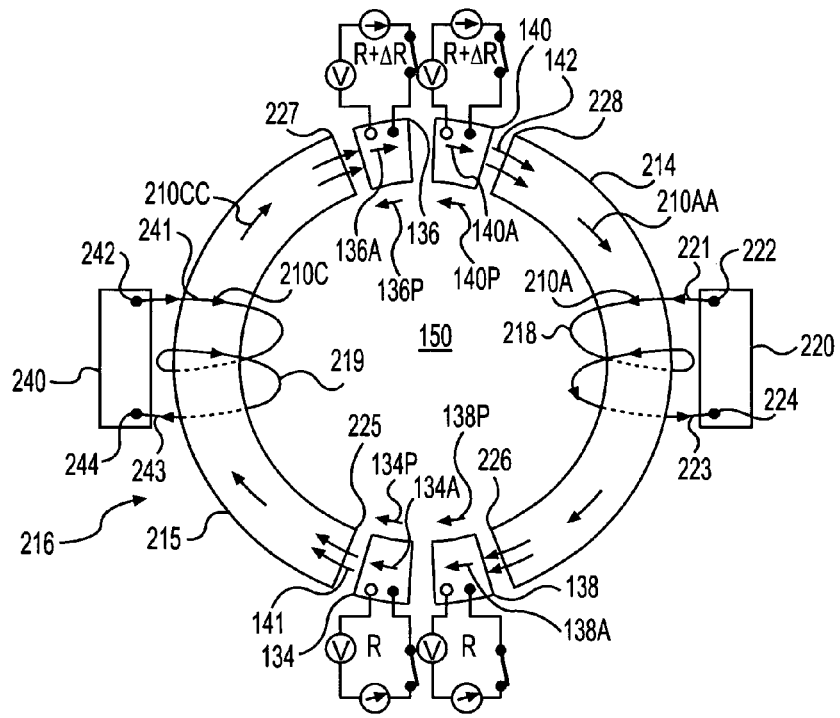
FIG. 5 is a plan view of a nonvolatile loop magnetic memory, the nonvolatile loop magnetic memory having first, second, third and fourth magnetically writeable magnetic memory elements, two half-loop magnetic shunt sections and two magnetic write coils, the first, second, third and fourth magnetically writeable magnetic memory elements being written by two clockwise magnetic fields generated by the two half-loop magnetic shunt sections, the two magnetic write coils and two write current generators.

In FIG. 5, memory elements 134 and 138 are located between first ends 225 and 226 respectively of half-loop sections 214 and 215. Memory element 134 has a parallel polarization 134A to pinned polarization 134P. Memory element 138 has a parallel polarization 138A to pinned polarization 138P. The parallel polarizations 134A and 138A give the magnetic memory element 134 and 138 a resistance R.

In FIG. 5, memory elements 136 and 140 are located between second ends 227 and 228 respectively of half-loop sections 214 and 215. Memory element 136 has an anti-parallel polarization 136A to pinned polarization 136P. Memory element 140 has an anti-parallel polarization 140A to pinned polarization 140P. The anti-parallel polarizations 136A and 140A give the magnetic memory elements 136 and 140 a resistance (R+Delta R).

FIG. 5 shows half-loop sections 214 and 215 of loop magnetic shunt 216. Two memory elements 134 and 138 are located between first ends 225 and 226 respectively of half-loop sections 214 and 215. Two memory elements 136 and 140 are located between second ends 227 and 228 respectively of half-loop sections 214 and 215. A magnetic field 141 is generated between first ends 225 and 226 of half-loop sections 214 and 215, by magnetic fields 210AA and 210CC respectively in half-loop sections 214 and 215, magnetic fields 210AA and 210CC being due to current 210A in coil 218 and current 210C in coil 219. A magnetic field 142 is generated between second ends 227 and 228 respectively of half-loop sections 214 and 215, by magnetic fields 210AA and 210CC respectively in half-loop sections 214 and 215, magnetic fields 210AA and 210CC being due to current 210A in coil 218 and current 210C in coil 219.

Magnetic field 141 causes memory elements 134 and 138 to have a resistance of R. Magnetic field 142 causes memory elements 136 and 140 to have a resistance of (R+Delta R). R signifies a zero bit in each of memory elements 134 and 138. (R+Delta R) signifies a one bit in memory elements 136 and 140.

Figure 6:
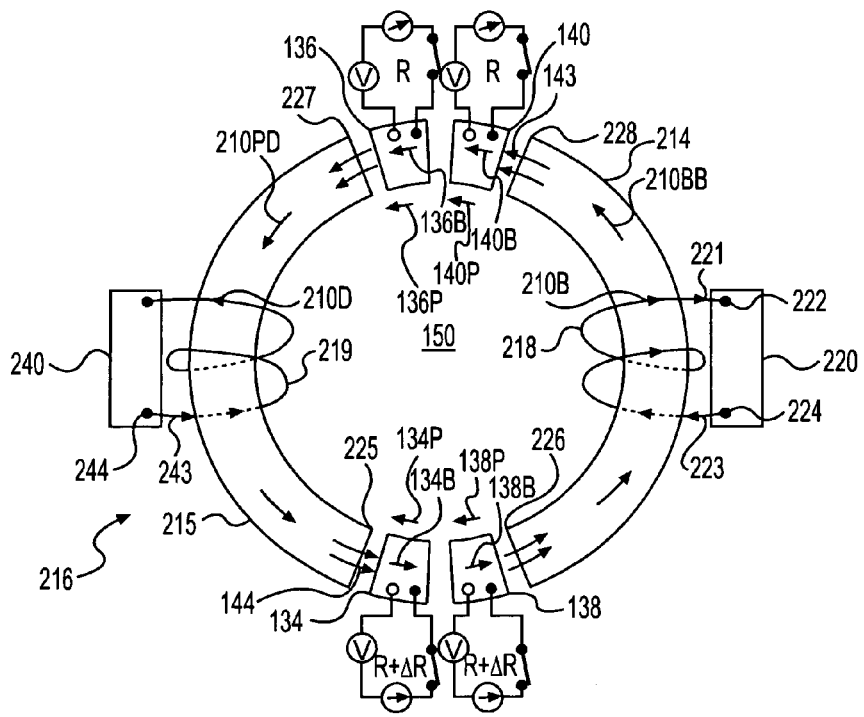
FIG. 6 is a plan view of a nonvolatile loop magnetic memory, the nonvolatile loop magnetic memory having first, second, third and fourth magnetically writeable magnetic memory elements, two half-loop magnetic shunt sections and two magnetic write coils, the first, second, third and fourth magnetically writeable magnetic memory elements being written by two counter-clockwise magnetic fields generated by the two half-loop magnetic shunt sections, the two magnetic write coils and two write current generators.

In FIG. 6, magnetic field 144 is generated between first ends 225 and 226 respectively of half-loop sections 214 and 215 by magnetic fields 210BB and 210DD respectively in half-loop sections 214 and 215, magnetic field 210BB being due to current 210B in coil 218, and magnetic field 210DD being due to current 210D in coil 219. In FIG. 6, magnetic field 143 is generated between second ends 227 and 228 respectively of half-loop sections 214 and 215 by magnetic fields 210BB and 210DD respectively in half-loop sections 214 and 215, magnetic field 210BB being due to current 210B in coil 218, and magnetic field 210DD being due to current 210D in coil 219. The resistances of the memory elements 134 and 138 are made to be (R+Delta R), due to magnetic field 144. The resistance of memory elements 136 and 140 are made to be R due to magnetic field 143. The resistances of memory elements 134, 136, 138 and 140 are reversed in FIG. 6, from their resistances shown in FIG. 5. In FIG. 6, (R+Delta R) signifies a one bit in each of memory elements 134 and 138 and R signifies a zero bit in each of memory elements 136 and 140.

Figure 7:
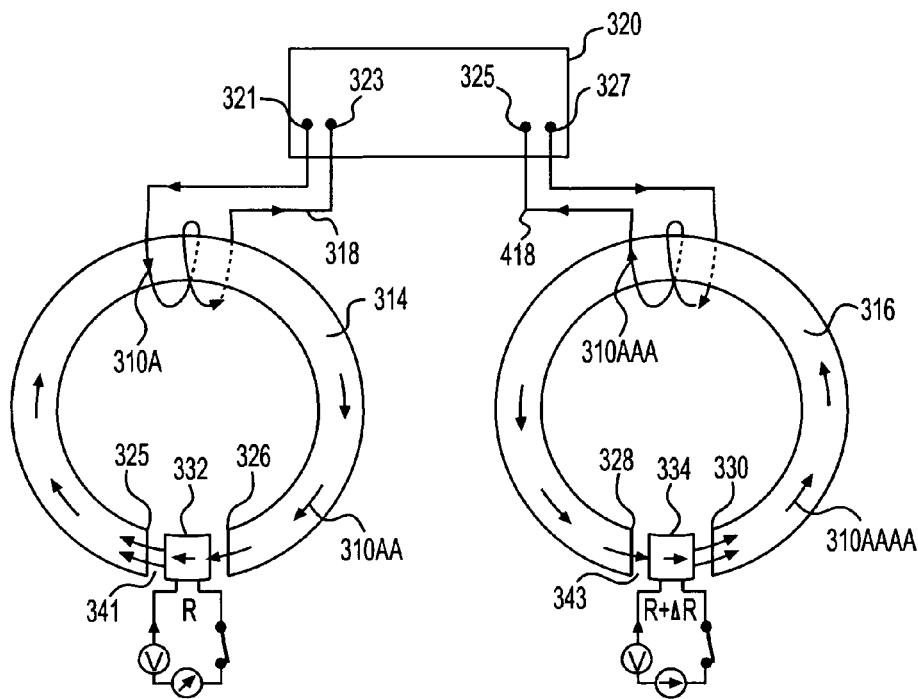
FIG. 7 is a plan view of two nonvolatile loop magnetic memories, a first nonvolatile loop magnetic memory having a magnetically writeable magnetic memory element, a slotted loop magnetic shunt and a magnetic write coil, and a second nonvolatile loop magnetic memory having a magnetically writeable magnetic memory element, a slotted loop magnetic shunt and a magnetic write coil, the first nonvolatile loop magnetic memory being written by a clockwise magnetic field generated by the slotted loop magnetic shunt and the magnetic write coil of the first nonvolatile loop magnetic memory, and a common write current generator, and the second nonvolatile loop magnetic memory being written by a counter-clockwise magnetic field generated by the slotted loop magnetic shunt and the magnetic write coil of the second nonvolatile loop magnetic memory, and a common write current generator.

In FIG. 7 write current generator 320 sends currents 310A and 310AAA, producing magnetic fields 310AA and 310AAAA respectively in shunts 314 and 316. Magnetic fields 310AA and 310AAAA produce magnetic fields 341 and 343 respectively. Field 341, that is due to current 310A from write current generator 320, writes a zero binary bit in memory element 332. Field 343 that is due to current 310AAA from write current generator 320 writes a one bit in memory element 334. Field 310AA in shunt 314 is driven by current 310A in coil 318. Field 310AAAA in shunt 316 is driven by current 310AAA in coil 418. A magnetic field 341 is generated between ends 325 and 326 of shunt 314. A magnetic field 343 is generated between ends 328 and 330 of shunt 316. Magnetic memory element 332, between ends 325 and 326 is given resistance of R, signifying a binary bit of zero, by magnetic field 341. Magnetic memory element 334, between ends 328 and 330, is given a resistance of (R+Delta R), signifying binary bit of one, by magnetic field 343.

In the FIG. 7 write current generator 320 energizes two coils 318 and 418, coils 318 and 418 wrapped, respectively, around magnetic shunts 314 and 316.

In FIG. 7 current 310A in coil 318 produces a magnetic field 341 and current 310AAA in coil 418 produces magnetic field 343. Magnetic element 332 is given a resistance R, a zero bit, and magnetic element 334 is given a resistance (R+Delta R), a one bit. Write current generator 320 drives the coils 318 and 418 of two magnetic shunts 314 and 316.

Figure 8:
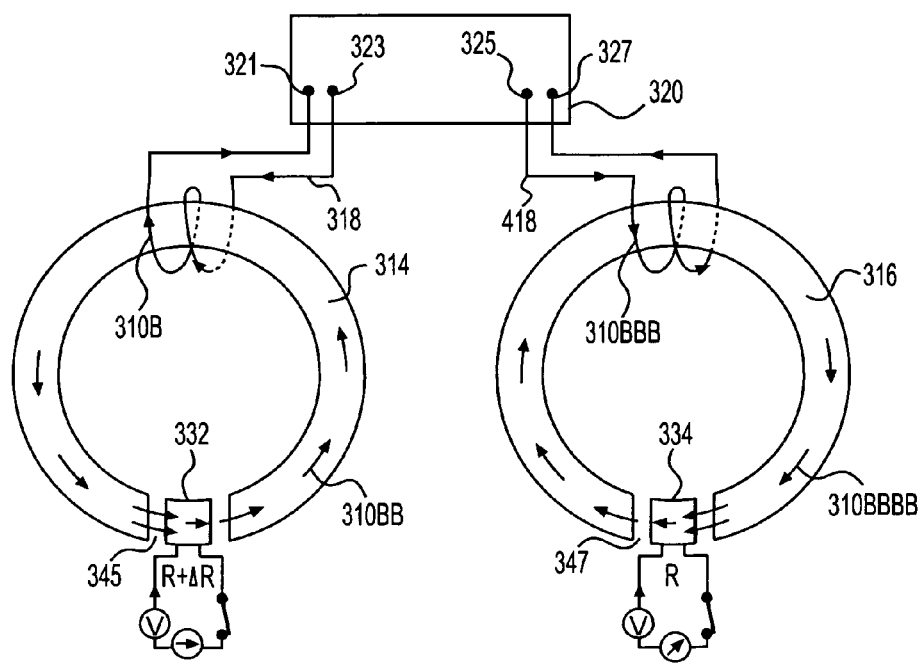
FIG. 8 is a plan view of two nonvolatile loop magnetic memories, a first nonvolatile loop magnetic memory having a magnetically writeable magnetic memory element, a slotted loop magnetic shunt and a magnetic write coil, and a second nonvolatile loop magnetic memory having a magnetically writeable magnetic memory element, a slotted loop magnetic shunt and a magnetic write coil, the first nonvolatile loop magnetic memory being written by a counter-clockwise magnetic field generated by the slotted loop magnetic shunt and the magnetic write coil of the first nonvolatile loop magnetic memory, and a common write current generator, and the second nonvolatile loop magnetic memory being written by a clockwise magnetic field generated by the slotted loop magnetic shunt and the magnetic write coil of the second nonvolatile loop magnetic memory, and a common write current generator.

In FIG. 8 current 310B in coil 318 produces a magnetic field 345 and current 310BBB in coil 418 produces magnetic field 347. Magnetic element 332 is given a resistance (R+Delta R), a one bit, and magnetic element 334 is given a resistance R, a zero bit. Write current generator 320 drives the coils 318 and 418 that are respectively wound around magnetic shunts 314 and 316.

Figure 9:
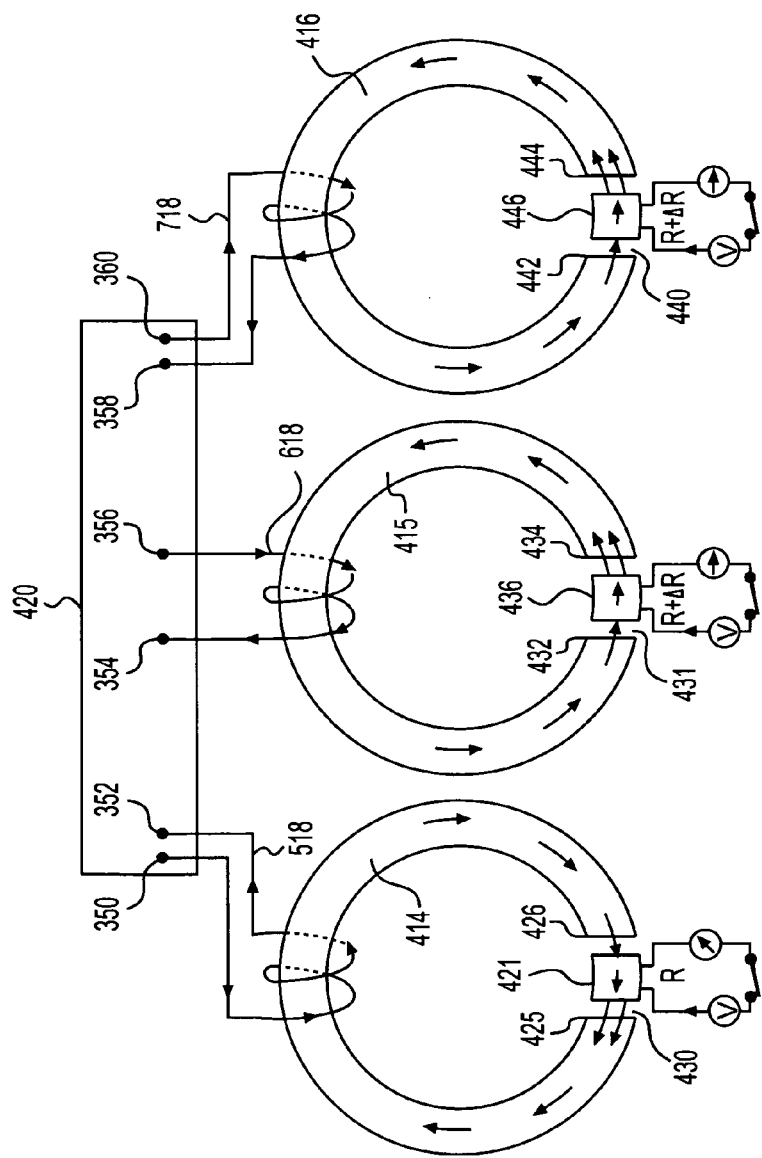
FIG. 9 is a plan view of three nonvolatile loop magnetic memories, a first nonvolatile loop magnetic memory having a magnetically writeable magnetic memory element, a slotted loop magnetic shunt and a magnetic write coil, a second nonvolatile loop magnetic memory having a magnetically writeable magnetic memory element, a slotted loop magnetic shunt and a magnetic write coil, and a third nonvolatile loop magnetic memory having a magnetically writeable magnetic memory element, a slotted loop magnetic shunt and a magnetic write coil, the first nonvolatile loop magnetic memory being written by a clockwise magnetic field generated by the slotted loop magnetic shunt and the magnetic write coil of the first nonvolatile loop magnetic memory, and a common write current generator, the second nonvolatile loop magnetic memory being written by a counter-clockwise magnetic field generated by the slotted loop magnetic shunt and the magnetic write coil of the second nonvolatile loop magnetic memory, and a common write current generator, and the third nonvolatile loop magnetic memory being written by a counter-clockwise magnetic field generated by the slotted loop magnetic shunt and the magnetic write coil of the third nonvolatile loop magnetic memory, and a common write current generator.

In FIG. 9, write current generator 420 sends a current through each of magnetic coils 518, 618 and 718 that are, respectively, wrapped around shunts 414, 415 and 416. A magnetic element 421 is between ends 425 and 426 of shunt 414. A magnetic field 430, generated between ends 425 and 426 of shunt 414, writes magnetic element 421 to have a resistance R, this resistance signifying a zero bit. A magnetic field 431, generated between ends 432 and 434 of shunt 415, writes magnetic element 436 to have a resistance (R+Delta R), this resistance signifying a one bit. A magnetic field 440, generated between ends 442 and 444 of shunt 416, writes magnetic element 446 to have a resistance (R+Delta R), this resistance signifying a one bit.

Figure 10:
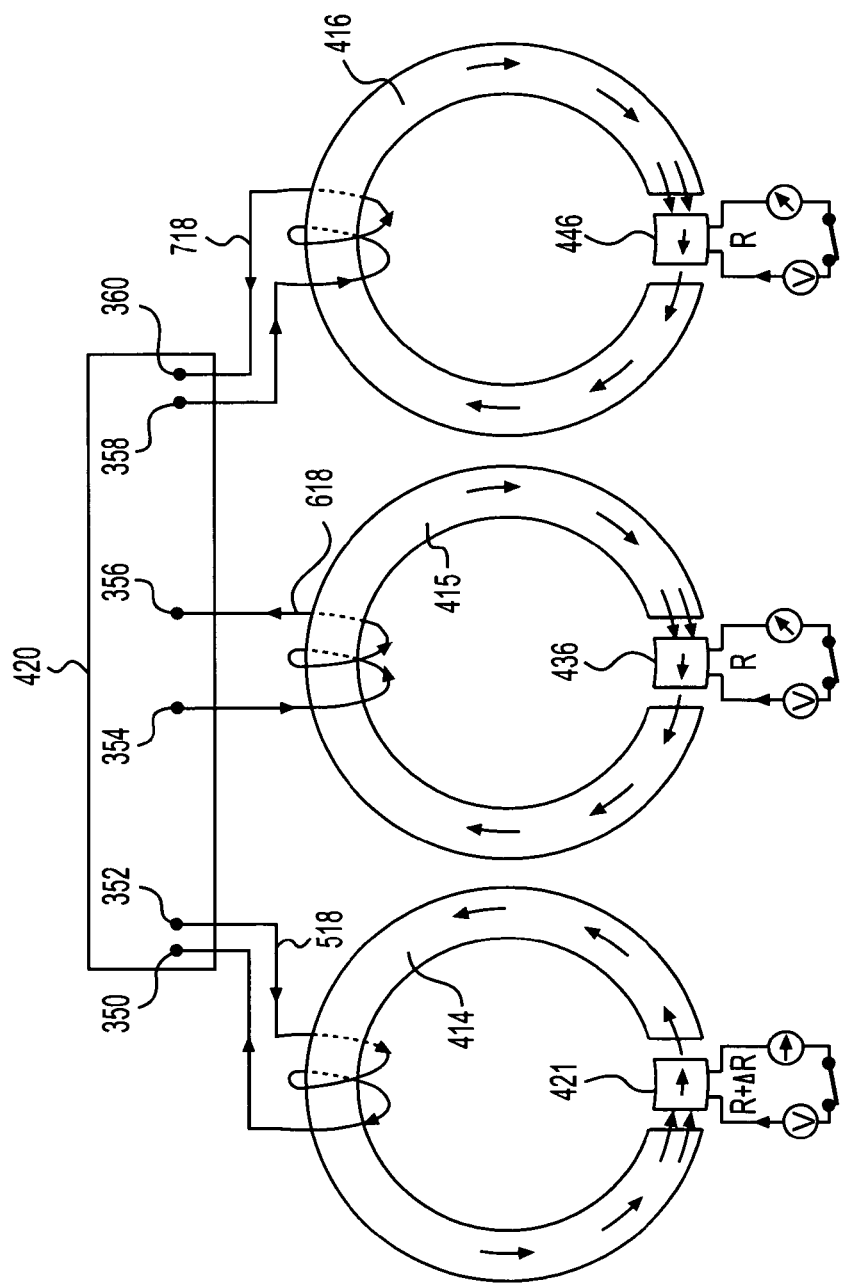
FIG. 10 is a plan view of three nonvolatile loop magnetic memories, a first nonvolatile loop magnetic memory having a magnetically writeable magnetic memory element, a slotted loop magnetic shunt and a magnetic write coil, a second nonvolatile loop magnetic memory having a magnetically writeable magnetic memory element, a slotted loop magnetic shunt and a magnetic write coil, and a third nonvolatile loop magnetic memory having a magnetically writeable magnetic memory element, a slotted loop magnetic shunt and a magnetic write coil, the first nonvolatile loop magnetic memory being written by a counter-clockwise magnetic field generated by the slotted loop magnetic shunt and the magnetic write coil of the first nonvolatile loop magnetic memory, and a common write current generator, the second nonvolatile loop magnetic memory being written by a clockwise magnetic field generated by the slotted loop magnetic shunt and the magnetic write coil of the second nonvolatile loop magnetic memory, and a common write current generator, and the third nonvolatile loop magnetic memory being written by a clockwise magnetic field generated by the slotted loop magnetic shunt and the magnetic write coil of the third nonvolatile loop magnetic memory, and a common write current generator.

In FIG. 10, a current in each of coils 518, 618 and 718 is reversed from a direction of a current in each of coils 518, 618 and 718, shown in FIG. 9, due to changes in directions of currents from write current generator 420. Magnetic element 421 is written to have a resistance of (R+Delta R), a one bit. Magnetic element 436 is written to have a resistance of R, a zero bit. Magnetic element 446 is written to have a resistance of R, a zero bit.

Figure 11:
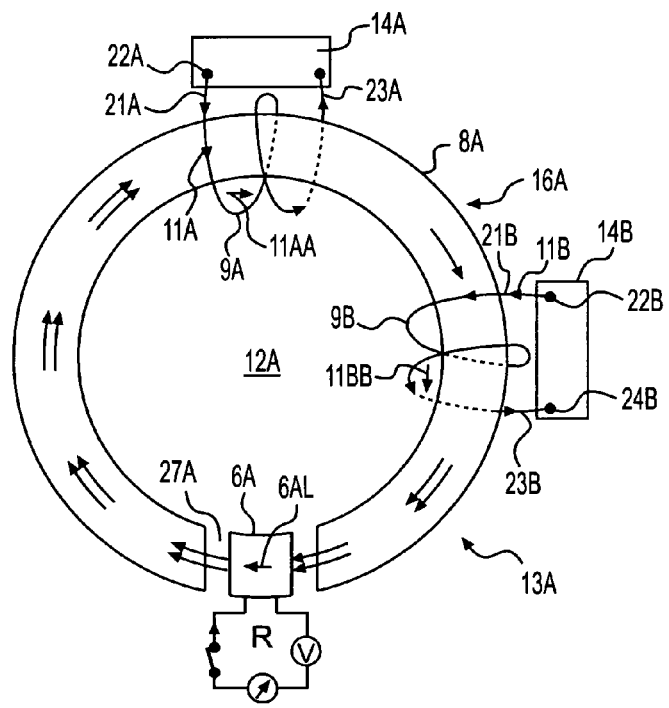
FIG. 11 is a plan view of a nonvolatile loop magnetic memory, the nonvolatile loop magnetic memory having a single magnetically writeable magnetic memory element, a single slotted loop magnetic shunt and first and second magnetic write coils, the single magnetically writeable magnetic memory element being written by a clockwise magnetic field generated by the single slotted loop magnetic shunt, the first and second magnetic write coils and first and second write current generators.

FIG. 11 shows a nonvolatile loop magnetic memory 12A comprising nonvolatile magnetic memory 6A, loop magnetic shunt 8A and two magnetic write coils 9A and 9B. Both magnetic write coils 9A and 9B are wrapped around loop magnetic shunt 8A.

In FIG. 11, current 11A, which is half of an amount of write current that is needed to write a binary zero bit into magnetic memory element 6A, is sent through half-write coil 9A. Current 11B, which is half of an amount of write current that is needed to write a binary zero bit into magnetic memory element 6A, is sent through half-write coil 9B. Two magnetic fields 11AA and 11BB, produced respectively by the two half-write currents 11A and 11B, taken together, produce a sufficiently large magnetic field 27A to write zero bit into magnetic memory element 6A. A half-write current 11A, passing through half-write coil 9A, is not large enough to form a sufficiently large magnetic field to write a zero bit into magnetic memory element 6A. A half-write current 11B, passing through half-write coil 9B, is not large enough to form a sufficiently large magnetic field to write a zero bit into magnetic memory element 6A. The two half-write currents 11A and 11B, flowing during the same time, together produce a sufficiently large magnetic field 27A to write a zero bit into magnetic memory element 6A.

The coil 9A is driven by write current generator 14A. The coil 9B is driven by write current generator 14B. The two half-write currents 11A and 11B, in coils 9A and 9B, respectively from write current generators 14A and 14B, are used in order to write a zero bit into magnetic memory element 6A of nonvolatile loop magnetic memory 12A. Magnetic field 27A is produced as a result of the addition in shunt 8A of magnetic fields 11AA and 11BB.

Figure 12:
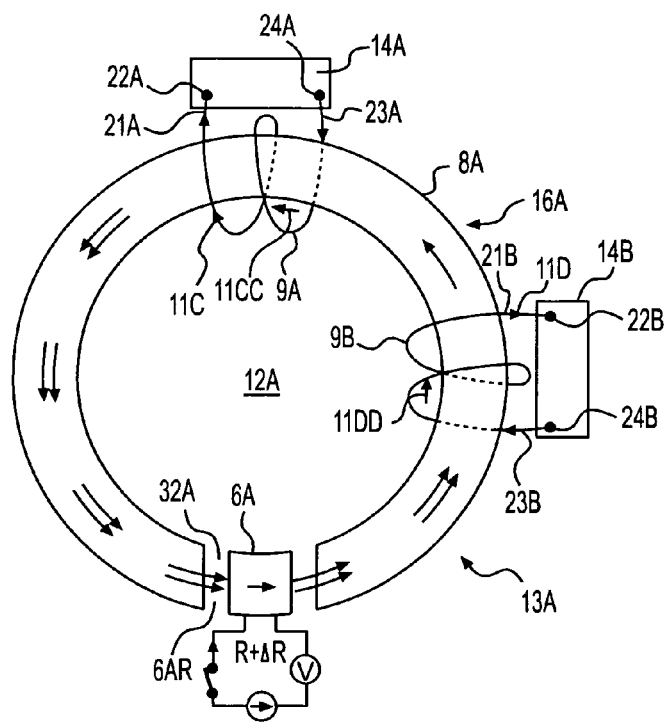
FIG. 12 is a plan view of a nonvolatile loop magnetic memory, the nonvolatile loop magnetic memory having a single magnetically writeable magnetic memory element, a single slotted loop magnetic shunt and first and second magnetic write coils, the single magnetically writeable magnetic memory element being written by a counter-clockwise magnetic field generated by the single slotted loop magnetic shunt, the first and second magnetic write coils and the first and second write current generators.

In FIG. 12, a one bit is written into nonvolatile loop magnetic memory 12A. A half-write current 11C is generated by write current generator 14A and a half-write current 11D is generated by write current generator 14B, in order to write a one bit into magnetic memory element 6A of loop magnetic memory 12A. Half-write current 11C produces magnetic field 11CC and half-write current 11D produces magnetic field 11DD. In FIG. 12 the two half write currents 11C and 11D pass through coils 9A and 9B in opposite directions to the directions of the half-write currents 11A and 11B, shown in FIG. 11. The two half-write currents 11C and 11D of FIG. 12 together produce a total magnetic polarization field 32A that is sufficiently large in order to write a one bit into magnetic memory element 6A. Magnetic field 32A is produced by shunt 8A by the addition, in shunt 8A, of magnetic fields 11CC and 11DD.

Figure 13:
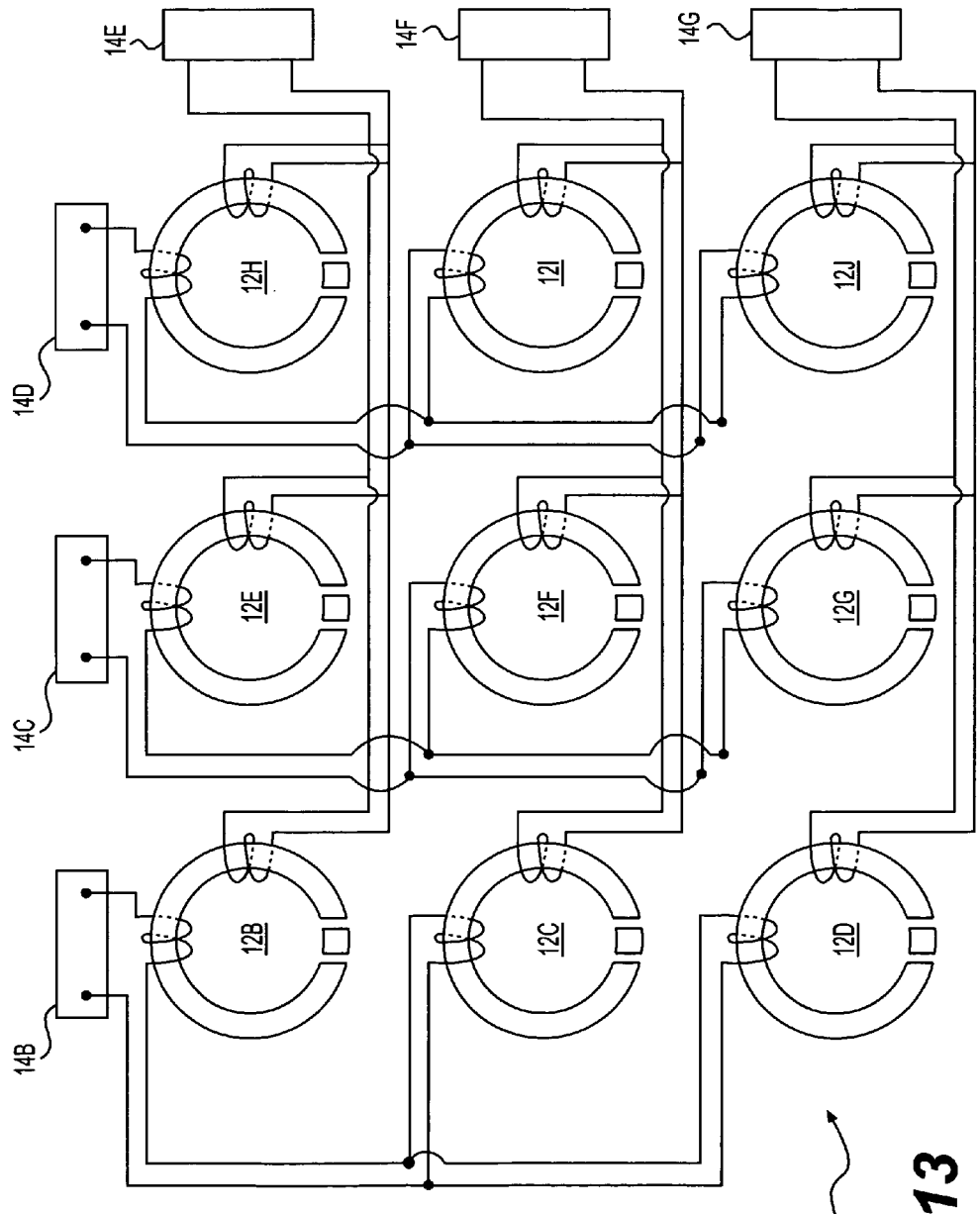
FIG. 13 is a plan view of an array of nonvolatile loop magnetic memories, each nonvolatile loop magnetic memory having a single magnetically writeable magnetic memory element, a single slotted loop magnetic shunt and first and second magnetic write coils, a selected nonvolatile loop magnetic memory being written by a magnetic field generated by a single slotted loop magnetic shunt of the selected loop magnetic memory, the first and second magnetic write coils of the selected loop magnetic memory and by the first and second write current generators that drive the first and second magnetic write coils of the selected nonvolatile loop magnetic memory.

In FIG. 13, nine nonvolatile loop magnetic memories 12B to 12J form a 3×3 loop magnetic memory array 2. Each nonvolatile loop magnetic memory has two write coils, a slotted loop magnetic shunt and a nonvolatile magnetic memory element in a slot of each slotted loop magnetic shunt. A nonvolatile magnetic memory element of each nonvolatile loop magnetic memory 12B to 12J of the loop magnetic memory array 2 is separately and selectively written into by the two write coils that are wrapped around the slotted magnetic shunt of each loop magnetic memory. Each nonvolatile loop magnetic memory 12B to 12J is written into as described for loop magnetic memory 12A of FIGS. 11 and 12. Each of the nine nonvolatile loop magnetic memories can be individually written into by selecting one of the three write current generators 14B, 14C and 14D, and by selecting one of the three write coil generators 14E, 14F and 14G. Each write coil generator is in series circuit with a series circuit of three nonvolatile loop magnetic memories. Each of the loop magnetic memories is individually written into by two half-write coils connected to two selected write current generators. A single half-write coil will not have a sufficient current to write a loop magnetic memory.

The loop magnetic memory array 2 holds nine binary bits. These nine binary bits can be separately written.

A binary one bit is written into loop magnetic memory 12B by means of write current generators 14B and 14E. The binary one bit is shown in FIG. 13 as being written into loop magnetic memory 12B by means of write current generators 14B and 14E. Memory 12B of FIG. 13 is written in a similar manner as memory 6A is written, as shown in FIG. 12.

All bits of a 3-bit word comprised of magnetic memory elements 12B, 12E and 12H can be written simultaneously with half write currents from each of write current generators 14B, 14C, 14D and 14E. With this arrangement, all three are written to the same state.

While the present invention has been disclosed in connection with the preferred embodiment thereof, it should be understood that there are other embodiments which fall within the spirit and scope of the invention as defined by the following claims.

What is claimed is:

1. A nonvolatile loop magnetic memory, comprising:
   (a) a magnetically writeable nonvolatile magnetic memory element;
   (b) a loop magnetic shunt, the loop magnetic shunt having a slot through a loop of the loop magnetic shunt, the slot forming first and second ends in the loop magnetic shunt, the first and second ends arranged to focus a magnetic field on the magnetically writeable nonvolatile magnetic memory element, the magnetically writeable nonvolatile magnetic memory element located between the first and second ends of the loop magnetic shunt; and
   (c) a magnetic write coil wrapped around the loop magnetic shunt.

2. A nonvolatile loop magnetic memory, comprising:
   (a) a magnetically writeable nonvolatile magnetic memory element;
   (b) a loop magnetic shunt, the loop magnetic shunt having a slot through a loop of the loop magnetic shunt, the slot forming first and second ends in the loop magnetic shunt, the first and second ends arranged to focus a magnetic field on the magnetically writeable nonvolatile magnetic memory element, the magnetically writeable nonvolatile magnetic memory element located between the first and second ends of the loop magnetic shunt; and
   (c) two magnetic write coils wrapped around the loop magnetic shunt.

3. A nonvolatile loop magnetic memory, comprising:
   (a) a magnetically writeable nonvolatile magnetic memory element;
   (b) a loop magnetic shunt, the loop magnetic shunt having a slot through a loop of the loop magnetic shunt, the slot forming first and second ends in the loop magnetic shunt, the first and second ends arranged to focus a magnetic field on the magnetically writeable nonvolatile magnetic memory element, the magnetically writeable nonvolatile magnetic memory element located between the first and second ends of the loop magnetic shunt; and
   (c) a plurality of magnetic write coils wrapped around the loop magnetic shunt.

4. A nonvolatile loop magnetic memory circuit, comprising:
   (a) a magnetically writeable nonvolatile magnetic memory element;
   (b) a loop magnetic shunt, the loop magnetic shunt having a slot through a loop of the loop magnetic shunt, the slot forming first and second ends in the loop magnetic shunt, the first and second ends arranged to focus a magnetic field on the magnetically writeable nonvolatile magnetic memory element, the magnetically writeable nonvolatile magnetic memory element located between the first and second ends of the loop magnetic shunt;
   (c) a magnetic write coil wrapped around the loop magnetic shunt; and
   (d) a write current generator electrically connected to the magnetic write coil.

5. A nonvolatile loop magnetic memory circuit, comprising:
   (a) a loop magnetic shunt, the loop magnetic shunt having first and second half-loop sections, each half-loop section having first and second ends;
   (b) a magnetic write coil encircling each half-loop section;
   (c) a write current generator electrically connected to each magnetic write coil; and
   (d) a plurality of magnetically writeable nonvolatile magnetic memory elements located between the first ends of the half-loop sections of the loop magnetic shunt and a plurality of magnetically writeable nonvolatile magnetic memory elements located between the second ends of the half-loop sections of the loop magnetic shunt.

6. A nonvolatile loop magnetic memory circuit, comprising:
   (a) a loop magnetic shunt, the loop magnetic shunt having first and second half-loop sections, each half-loop section having first and second ends;
   (b) a magnetic write coil encircling each half-loop section;
   (c) a write current generator electrically connected to each magnetic write coil; and
   (d) a nonvolatile magnetic tunnel junction memory element located between the first ends of the half-loop sections of the semicircular loop magnetic shunt and a nonvolatile magnetic tunnel junction memory element located between the second ends of the half-loop sections of the semicircular loop magnetic shunt.

7. A nonvolatile loop magnetic memory circuit, comprising:
   (a) a loop magnetic shunt, the loop magnetic shunt having first and second ends;
   (b) a magnetic write coil encircling the loop magnetic shunt;

(c) a write current generator electrically connected to the magnetic write coil; and (d) a plurality of nonvolatile magnetic tunnel junction memory elements located between the first and second ends of the loop magnetic shunt.

8. A nonvolatile loop magnetic memory array, comprising:

(a) an array of magnetically writeable nonvolatile magnetic memory elements;

(b) an array of loop magnetic shunts, each loop magnetic shunt having a loop, a slot being through each loop, each slot forming first and second ends in the loop, the first and second ends arranged to focus a magnetic field on a magnetically writeable nonvolatile magnetic memory element, a magnetically writeable nonvolatile magnetic memory element located between the first and second ends of each loop; and (c) a plurality of magnetic write coils wrapped around the loop of each loop magnetic shunt.

\* \* \* \* \*